(12) United States Patent
Ishibashi et al.

(10) Patent No.: US 11,823,863 B2
(45) Date of Patent: *Nov. 21, 2023

(54) ION IMPLANTER AND MODEL GENERATION METHOD

(71) Applicant: SUMITOMO HEAVY INDUSTRIES ION TECHNOLOGY CO., LTD., Tokyo (JP)

(72) Inventors: Kazuhisa Ishibashi, Ehime (JP); Tetsuya Kudo, Ehime (JP); Mikio Yamaguchi, Ehime (JP)

(73) Assignee: SUMITOMO HEAVY INDUSTRIES ION TECHNOLOGY CO, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,130

(22) Filed: Oct. 25, 2022

(65) Prior Publication Data
US 2023/0038439 A1 Feb. 9, 2023

Related U.S. Application Data

(63) Continuation of application No. 17/191,218, filed on Mar. 3, 2021, now Pat. No. 11,527,381.

(30) Foreign Application Priority Data

Mar. 4, 2020 (JP) .................................. 2020-036546

(51) Int. Cl.
*H01J 37/317* (2006.01)
*H01J 37/304* (2006.01)

(52) U.S. Cl.
CPC ........ *H01J 37/3171* (2013.01); *H01J 37/304* (2013.01); *H01J 2237/30416* (2013.01); *H01J 2237/31703* (2013.01)

(58) Field of Classification Search
CPC ................. H01J 37/304; H01J 37/3171; H01J 2237/30416; H01J 2237/31703
See application file for complete search history.

(56) References Cited

U.S. PATENT DOCUMENTS 6,797,967 B1  9/2004  Tse et al.
7,709,817 B2 *  5/2010  Burgess .............. H01J 37/3171
702/199

(Continued)

FOREIGN PATENT DOCUMENTS

JP   H05-047342 A   2/1993
JP   H05-135729 A   6/1993
(Continued)

*Primary Examiner* — David E Smith
(74) *Attorney, Agent, or Firm* — Michael Best & Friedrich LLP

(57) ABSTRACT

An ion implanter including a beam generation device that generates an ion beam, based on an implantation recipe, a plurality of measurement devices that measure beam currents of the ion beam, and a control device. The control device acquires a data set including the beam currents and an implantation parameter in the implantation recipe, and evaluates measurement validity of the beam currents of the ion beam by using the model. The implantation parameter may be one of ion species, beam energy, a beam current, a beam size, a wafer tilt angle, a wafer twist angle and an average dose. The model may be built based on a plurality of past data sets acquired during a plurality of implantation process based on the implantation recipe.

13 Claims, 8 Drawing Sheets

(56) References Cited

U.S. PATENT DOCUMENTS

| 9,379,030 | B2 | | 6/2016 | Ninomiya et al. | |
|---|---|---|---|---|---|
| 11,527,381 | B2 | * | 12/2022 | Ishibashi | H01J 37/3171 |
| 2009/0084757 | A1 | * | 4/2009 | Erokhin | H01J 37/3053 |
| | | | | | 204/298.36 |
| 2020/0251360 | A1 | * | 8/2020 | Liao | G05B 23/0254 |
| 2021/0175048 | A1 | * | 6/2021 | Wilson | H01J 37/244 |

FOREIGN PATENT DOCUMENTS

| JP | H06-084491 A | 3/1994 |
|---|---|---|
| JP | H09-082266 A | 3/1997 |
| JP | 2008-004543 A | 1/2006 |
| JP | 2014-049653 A | 3/2014 |
| JP | 2017-033920 A | 2/2017 |

* cited by examiner

ION IMPLANTER AND MODEL GENERATION METHOD

RELATED APPLICATIONS

This is a continuation of U.S. patent application Ser. No. 17/191,218 filed on Mar. 3, 2021, the contents of which, including the specification, the claims and the drawings, are incorporated herein by reference in their entirety. The content of Japanese Patent Application No. 2020-036546, on the basis of which priority benefits are claimed in an accompanying application data sheet, is in its entirety incorporated herein by reference.

BACKGROUND

Technical Field

Certain embodiments of the present invention relate to an ion implanter and a model generation method.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. A device used for the ion implantation process is called an ion implanter. In the related art, the ion implanter is configured as follows. The ion implanter measures physical quantities such as a beam current and a beam angle of an ion beam with which the wafer is to be irradiated, and adjusts the ion beam, based on a measurement value, thereby realizing ion implantation accuracy required for desired implantation conditions.

SUMMARY

According to an embodiment of the present invention, there is provided an ion implanter including a beam generation device that generates an ion beam, based on an implantation recipe, a plurality of measurement devices that measure at least one physical quantity of the ion beam, and a control device that acquires a data set including a plurality of measurement values measured by the plurality of measurement devices, and evaluates measurement validity of the at least one physical quantity of the ion beam by using a model representing a correlation between the plurality of measurement values.

According to another embodiment of the present invention, there is provided a model generation method. The method includes acquiring a data set including a plurality of measurement values indicating at least one physical quantity of an ion beam generated based on an implantation recipe from a plurality of measurement devices that measure the ion beam, and building a model representing a correlation between the plurality of measurement values from a plurality of the data sets acquired during a plurality of implantation processes performed based on the implantation recipe.

DETAILED DESCRIPTION

Figure 1:
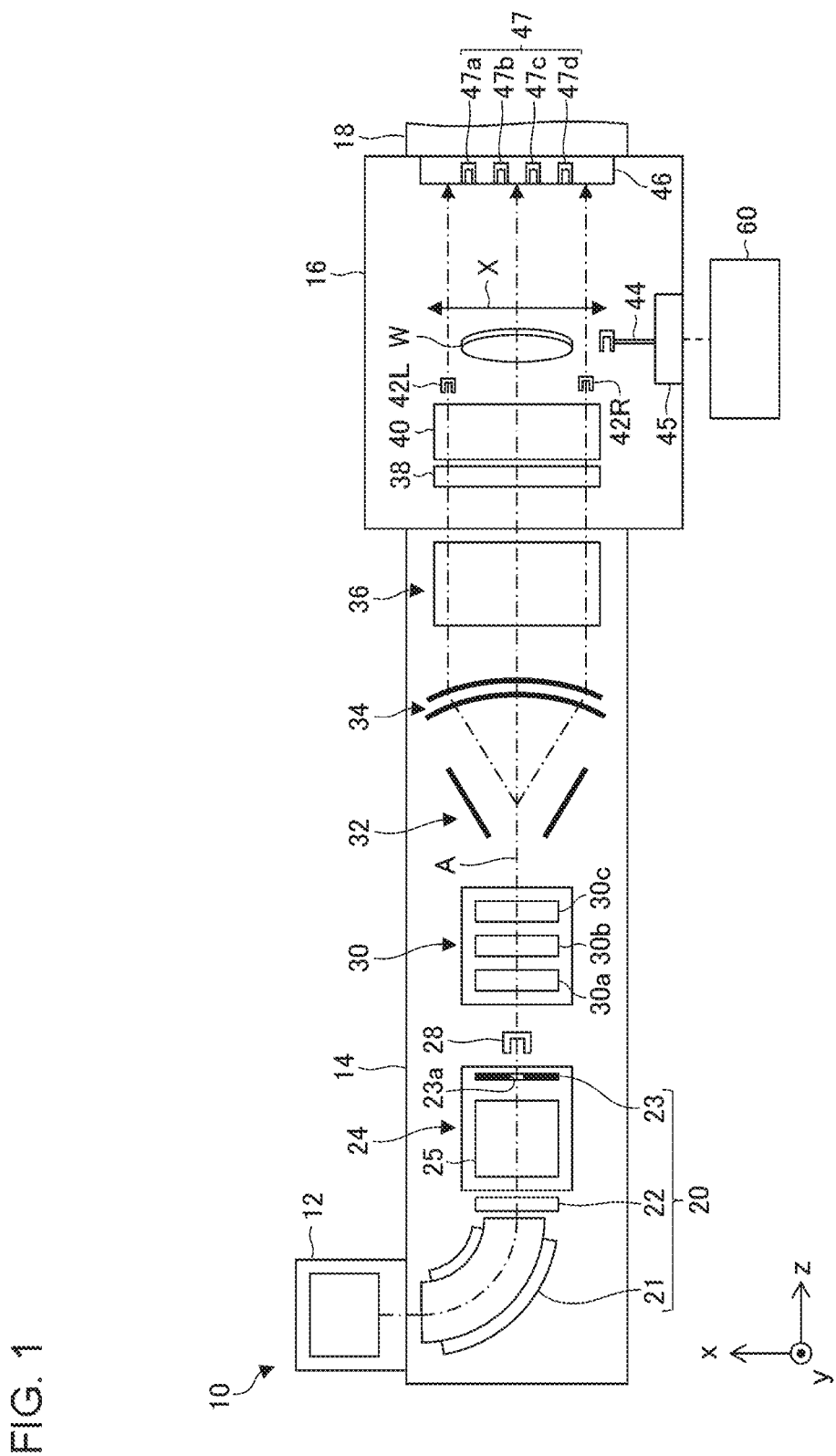
FIG. 1 is a top view illustrating a schematic configuration of an ion implanter according to an embodiment.

In order to improve implantation accuracy, it is conceivable to use a highly accurate measurement device. However, when there is any abnormality in measurement itself, correct measurement cannot be performed even if the highly accurate measurement device is used. In this case, beam adjustment and an implantation process are performed, based on an incorrect measurement value. Consequently, there is a possibility that the required implantation accuracy may not be realized.

It is desirable to provide a technique for evaluating measurement validity of physical quantities.

Any desired combination of the above-described components, and those in which the components or expressions according to the present invention are substituted with each other between methods, devices, or systems are effectively applicable as an aspect of the present invention.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Before the embodiments are described in detail, an outline will be described. An ion implanter according to the present embodiment generates an ion beam, based on a desired implantation recipe, and measures at least one physical quantity of the ion beam by using a plurality of measurement devices. The plurality of measurement devices are disposed at various locations inside the ion implanter, and configured to measure a beam current as an example of the physical quantity. The plurality of measurement devices measure the same ion beam. Therefore, when measurement itself of each measurement device is normal, it is considered that a plurality of measurement values measured by the plurality of measurement devices have a specified correlation such as a proportional relationship. When an abnormality occurs in the measurement performed by any one of the measurement devices, it is expected that the correlation between the plurality of measurement values is broken.

Therefore, in the present embodiment, a model representing the correlation between the plurality of measurement values for normal implantations is built in advance, and the correlation between the plurality of measurement values for any performed implantation is evaluated by using the model as a reference. For example, it is calculated how much the correlation between the plurality of measurement values during the implantation deviates from the model serving as the reference, and measurement validity is evaluated, based on a deviation amount thereof. In this manner, it is possible to detect a measurement error caused by a fact that the measurement itself is abnormal. Furthermore, the measurement value can be corrected, based on the model. Accordingly, beam adjustment or dose control can be performed, based on a more accurately corrected measurement value. In this manner, extremely strict implantation accuracy required in recent years can be realized, and reliability in an ion implantation process can be improved.

Figure 2:
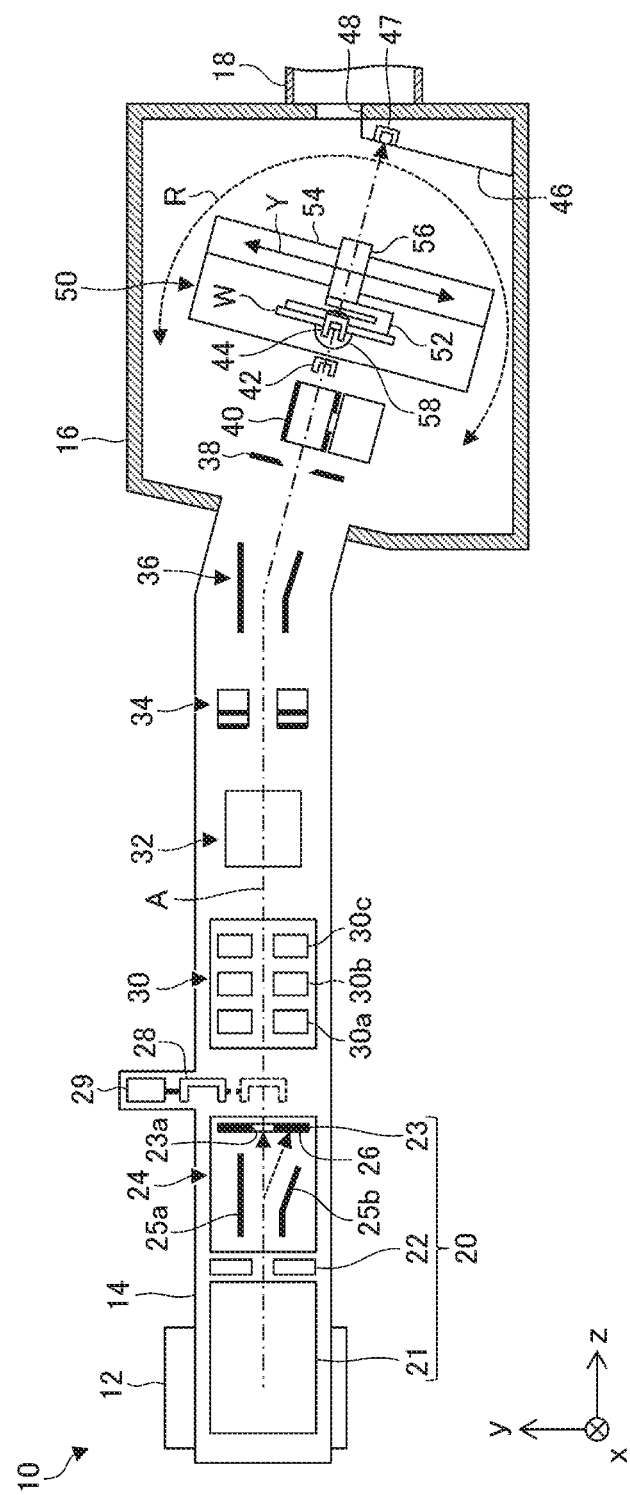
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process on a surface of a workpiece W. For example, the workpiece W is a substrate, and is a semiconductor wafer. For convenience of description, the workpiece W may be referred to as a wafer W in the specification herein. However, this is not intended to limit an implantation processing target to a specific object.

The ion implanter 10 is configured to irradiate a whole processing surface of the wafer W with the ion beam by performing reciprocating scanning using the ion beam in one direction and causing the wafer W to reciprocate in a direction perpendicular to the scanning direction. In the specification herein, for convenience of description, a traveling direction of the ion beam traveling along a designed beamline A is defined as a z-direction, and a plane perpendicular to the z-direction is defined as an xy-plane. When the workpiece W is scanned with the ion beam, the scanning direction of the beam is defined as an x-direction, and a direction perpendicular to the z-direction and the x-direction is defined as a y-direction. Therefore, the reciprocating scanning using the beam is performed in the x-direction, and a reciprocating motion of the wafer W is performed in the y-direction.

The ion implanter 10 includes an ion generation device 12, a beamline device 14, an implantation processing chamber 16, and a wafer transfer device 18. The ion generation device 12 is configured to provide the ion beam for the beamline device 14. The beamline device 14 is configured to transport the ion beam from the ion generation device 12 to the implantation processing chamber 16. The implantation processing chamber 16 accommodates the wafer W serving as an implantation target, and an implantation process of irradiating the wafer W with the ion beam provided from the beamline device 14 is performed in the implantation processing chamber 16. The wafer transfer device 18 is configured to load an unprocessed wafer before the implantation process into the implantation processing chamber 16, and unload a processed wafer after the implantation process from the implantation processing chamber 16. The ion implanter 10 includes a vacuum system (not illustrated) for providing a desired vacuum environment for the ion generation device 12, the beamline device 14, the implantation processing chamber 16, and the wafer transfer device 18.

The beamline device 14 includes a mass analyzing unit 20, a beam park device 24, a beam shaping unit 30, a beam scanning unit 32, a beam parallelizing unit 34, and an angular energy filter (AEF) 36, in order from an upstream side of the beamline A. The upstream side of the beamline A means a region closer to the ion generation device 12, and a downstream side of the beamline A means a region closer to the implantation processing chamber 16 (or a beam stopper 46).

The mass analyzing unit 20 is provided downstream of the ion generation device 12, and is configured to select a required ion species from the ion beam extracted from the ion generation device 12 by performing mass analyzing. The mass analyzing unit 20 has a mass analyzing magnet 21, a mass analyzing lens 22, and a mass analyzing slit 23.

The mass analyzing magnet 21 applies a magnetic field to the ion beam extracted from the ion generation device 12, and deflects the ion beam to travel in a specific path in accordance with a value of the mass-to-charge ratio $M=m/q$ (here, m is mass, and q is charge) of the ions. For example, the mass analyzing magnet 21 applies the magnetic field in the y-direction (−y-direction in FIGS. 1 and 2) to the ion beam so that the ion beam is deflected in the x-direction. Intensity of the magnetic field of the mass analyzing magnet 21 is adjusted so that the ion species having a desired mass-to-charge ratio M passes through the mass analyzing slit 23.

The mass analyzing lens 22 is provided downstream of the mass analyzing magnet 21, and is configured to adjust focusing/defocusing power for the ion beam. The mass analyzing lens 22 adjusts a focusing position of the ion beam passing through the mass analyzing slit 23 in a beam traveling direction (z-direction), and adjusts a mass resolution M/dM of the mass analyzing unit 20. The mass analyzing lens 22 is not an essential component, and the mass analyzing unit 20 may not have the mass analyzing lens 22.

The mass analyzing slit 23 is provided downstream of the mass analyzing lens 22, and is provided at a position away from the mass analyzing lens 22. The mass analyzing slit 23 is configured so that a beam deflection direction (x-direction) by the mass analyzing magnet 21 is a slit width direction, and has an opening 23a that is relatively short in the x-direction and relatively long in the y-direction.

The mass analyzing slit 23 may be configured so that the slit width is variable for adjusting the mass resolution. The mass analyzing slit 23 may be configured to include two blockade bodies that are movable in the slit width direction, and may be configured so that the slit width is adjustable by changing an interval between the two blockade bodies. The mass analyzing slit 23 may be configured so that the slit width is variable by selecting any one of a plurality of slits having different slit widths.

The beam park device 24 is configured to cause the ion beam to temporarily retreat from the beamline A and to temporarily block the ion beam directed to the implantation processing chamber 16 (or the wafer W) located downstream. The beam park device 24 can be disposed at any desired position in an intermediate portion of the beamline A. For example, the beam park device 24 can be disposed between the mass analyzing lens 22 and the mass analyzing slit 23. A prescribed distance is required between the mass analyzing lens 22 and the mass analyzing slit 23. Accordingly, the beam park device 24 is disposed between both of them. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces in a direction (y-direction) perpendicular to the beam deflection direction (x-direction) by the mass analyzing magnet 21. The beam dump 26 is provided on the downstream side of the beamline A than the park electrodes 25a and 25b, and is provided away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is provided at a position away to the lower side of the beamline A in the direction of gravity, and is disposed on the lower side of the opening 23a of the mass analyzing slit 23 in the direction of gravity. For example, the beam dump 26 is configured to include a portion of the mass analyzing slit 23 where the opening 23a is not formed. The beam dump 26 may be configured to separate from the mass analyzing slit 23.

The beam park device 24 deflects the ion beam by using an electric field applied between the pair of park electrodes 25a and 25b, and causes the ion beam to retreat from the beamline A. For example, a negative voltage is applied to the second park electrode 25b, based on a potential of the first park electrode 25a. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same potential. The beam park device 24 is configured to be operable by switching between a first mode in which the ion beam passes through the downstream side and a second mode in which the ion beam is incident into the beam dump 26.

An injector Faraday cup 28 is provided downstream of the mass analyzing slit 23. The injector Faraday cup 28 is configured to be movable into and out of the beamline A by an operation of an injector driving unit 29. The injector driving unit 29 moves the injector Faraday cup 28 in a direction (for example, the y-direction) perpendicular to an extending direction of the beamline A. When the injector Faraday cup 28 is disposed on the beamline A as illustrated by a dashed line in FIG. 2, the injector Faraday cup 28 blocks the ion beam directed toward the downstream side. On the other hand, as illustrated by a solid line in FIG. 2, when the injector Faraday cup 28 retreat from the beamline A, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the intensity of the magnetic field of the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam having passed through the mass analyzing unit 20 to have a desired cross-sectional shape. For example, the beam shaping unit 30 is configured to include an electric field type three-stage quadrupole lens (also referred to as a triplet Q-lens), which has three quadrupole lenses 30a, 30b, and 30c. The beam shaping unit 30 adopts the three lens devices 30a to 30c. Accordingly, the beam shaping unit 30 can adjust the ion beam to converge or diverge independently in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by a one dot chain line.

The beam parallelizing unit 34 is configured so that the traveling direction of the ion beam used for the scanning becomes parallel to the trajectory of the designed beamline A. The beam parallelizing unit 34 has a plurality of arc-shaped parallelizing lens electrodes in which an ion beam passing slit is provided in a central portion in the y-direction. The parallelizing lens electrode is connected to a high-voltage power supply (not illustrated), and applies an electric field generated by voltage application to the ion beam so that the traveling directions of the ion beam are parallelized. The beam parallelizing unit 34 may be replaced with another beam parallelizing device, and the beam parallelizing device may be configured to serve as a magnet device using a magnetic field.

An acceleration/deceleration (AD) column (not illustrated) for accelerating or decelerating the ion beam may be provided downstream of the beam parallelizing unit 34.

The angular energy filter (AEF) 36 is configured to analyze energy of the ion beam, to deflect ions having necessary energy downward, and to guide the ions to the implantation processing chamber 16. The angular energy filter 36 has an AEF electrode pair for deflection by an electric field. The AEF electrode pair is connected to a high-voltage power supply (not illustrated). In FIG. 2, the ion beam is deflected downward by applying a positive voltage to the upper AEF electrode and applying a negative voltage to the lower AEF electrode. The angular energy filter 36 may be configured to include a magnet device for deflection by a magnetic field, or may be configured to include a combination between the AEF electrode pair for deflection by the electric field and the magnet device for deflection by the magnetic field.

In this way, the beamline device 14 supplies the ion beam to be used for irradiating the wafer W to the implantation processing chamber 16. In the present embodiment, the ion generation device 12 and the beamline device 14 are also referred to as a beam generation device. The beam generation device is configured to generate the ion beam for realizing a desired implantation condition by adjusting operation parameters of various devices constituting the beam generation device.

The implantation processing chamber 16 includes an energy slit 38, a plasma shower device 40, side cups 42 (42L and 42R), a profiler cup 44, and a beam stopper 46, in order from the upstream side of the beamline A. As illustrated in FIG. 2, the implantation processing chamber 16 includes a platen driving device 50 that holds one or more wafers W.

The energy slit 38 is provided on the downstream side of the angular energy filter 36, and analyzes the energy of the ion beam incident into the wafer W together with the angular energy filter 36. The energy slit 38 is an energy defining slit (EDS) configured to include a slit that is horizontally long in the beam scanning direction (x-direction). The energy slit 38 causes the ion beam having a desired energy value or a desired energy range to pass toward the wafer W, and blocks the other ion beams.

The plasma shower device 40 is located on the downstream side of the energy slit 38. The plasma shower device 40 supplies low-energy electrons to the ion beam and a surface of the wafer W (wafer processing surface) in accordance with a beam current amount of the ion beam, and suppresses an accumulation of positive charges on the wafer processing surface which are induced by ion implantation. For example, the plasma shower device 40 includes a shower tube through which the ion beam passes, and a plasma generation device that supplies electrons into the shower tube.

The side cups 42 (42L and 42R) are configured to measure the beam current of the ion beam during the ion implantation process into the wafer W. As illustrated in FIG. 2, the side cups 42L and 42R are disposed to be shifted to the left and right (x-direction) with respect to the wafer W disposed on the beamline A, and are disposed at positions where the side cups 42L and 42R do not block the ion beam directed toward the wafer W during the ion implantation. The ion beam is subject to scanning in the x-direction beyond a range where the wafer W is located. Accordingly, a portion of the beam for the scanning is incident into the side cups 42L and 42R even during the ion implantation. In this manner, the beam current amount during the ion implantation process is measured by the side cups 42L and 42R.

The profiler cup 44 is configured to measure the beam current on the wafer processing surface. The profiler cup 44 is configured to be movable by an operation of the profiler driving device 45, is retreated from an implantation position where the wafer W is located during the ion implantation, and is inserted into the implantation position when the wafer W is not located at the implantation position. The profiler cup 44 measures the beam current while moving in the x-direction. In this manner, the profiler cup 44 can measure the beam current over the whole beam scanning range in the x-direction. In the profiler cup 44, a plurality of Faraday cups may be aligned in the x-direction to be formed as an array so that the beam currents can be simultaneously measured at a plurality of positions in the beam scanning direction (x-direction).

At least one of the side cups 42 and the profiler cup 44 may include a single Faraday cup for measuring a beam current amount, or may include an angle measurement device for measuring angle information of the beam. For example, the angle measurement device includes a slit and a plurality of current detectors provided away from the slit in the beam traveling direction (z-direction). For example, the angle measurement device can measure an angle component of the beam in the slit width direction by causing the plurality of current detectors aligned in the slit width direction to measure the beams having passed through the slit. At least one of the side cups 42 and the profiler cup 44 may include a first angle measurement device capable of measuring angle information in the x-direction and a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism 58. The wafer holding device 52 includes an electrostatic chuck or the like for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating movement of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as a rotation center axis. In this manner, the twist angle adjusting mechanism 56 adjusts a twist angle between an alignment mark provided on an outer peripheral portion of the wafer and a reference position. Here, the alignment mark of the wafer means a notch or an orientation flat provided on the outer peripheral portion of the wafer, and means a mark that serves as a reference for a crystal axis direction of the wafer or an angular position in a circumferential direction of the wafer. The twist angle adjusting mechanism 56 is provided between the wafer holding device 52 and the reciprocating mechanism 54, and is caused to reciprocate together with the wafer holding device 52.

The tilt angle adjusting mechanism 58 adjusts tilting of the wafer W, and adjusts a tilt angle between the traveling direction of the ion beam directed toward the wafer processing surface and the normal line of the wafer processing surface. In the present embodiment, out of the tilt angles of the wafer W, an angle with respect to which the axis in the x-direction is a rotation center axis is adjusted as the tilt angle. The tilt angle adjusting mechanism 58 is provided between the reciprocating mechanism 54 and an inner wall of the implantation processing chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between an implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect with each other. The transfer position of the wafer W corresponds to a position of the wafer holding device 52 when the wafer W is loaded or unloaded through a transfer port 48 by a transfer mechanism or a transfer robot provided in the wafer transfer device 18.

The beam stopper 46 is provided on the most downstream side of the beamline A, and is mounted on the inner wall of the implantation processing chamber 16, for example. When the wafer W does not exist on the beamline A, the ion beam is incident into the beam stopper 46. The beam stopper 46 is located close to the transfer port 48 that connects the implantation processing chamber 16 and the wafer transfer device 18 to each other, and is provided at a position vertically below the transfer port 48.

The beam stopper 46 has a plurality of tuning cups 47 (47a, 47b, 47c, and 47d). The plurality of tuning cups 47 are Faraday cups configured to measure the beam current of the ion beam incident into the beam stopper 46. The plurality of tuning cups 47 are disposed with intervals in the x-direction. For example, the plurality of tuning cups 47 are used for easily measuring the beam current at the implantation position without using the profiler cup 44.

The side cups 42 (42L and 42R), the profiler cup 44, and tuning cups 47 (47a to 47d) are a plurality of measurement devices for measuring the beam current as a physical quantity of the ion beam. The side cups 42 (42L and 42R), the profiler cup 44, and the tuning cups 47 (47a to 47d) may be a plurality of measurement devices for measuring the beam angle as a physical quantity of the ion beam.

The ion implanter 10 further includes a control device 60. The control device 60 controls an overall operation of the ion implanter 10. The control device 60 is realized in hardware by elements such as a CPU and a memory of a computer or a mechanical device, and in software by a computer program or the like. Various functions provided by the control device 60 can be realized by cooperation between the hardware and the software.

Figure 3:
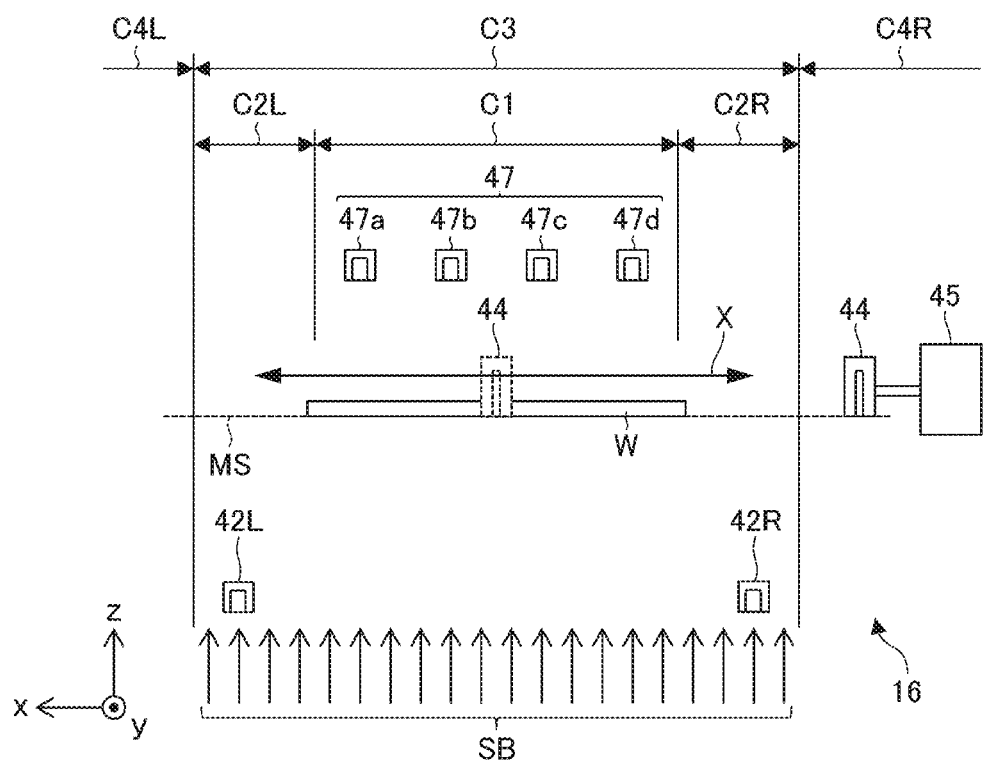
FIG. 3 is a top view schematically illustrating a configuration of an implantation processing chamber.

FIG. 3 is a top view schematically illustrating a configuration inside the implantation processing chamber 16, and illustrates a state where a plurality of measurement devices disposed inside the implantation processing chamber 16 measure a scan beam SB. The ion beam B is subject to reciprocating scanning in the x-direction as indicated by an arrow X, and is incident into the wafer W, as the scan beam SB.

The ion beam B is subject to reciprocating scanning over an irradiation range C3 including an implantation range C1 where the wafer W is located and monitor ranges C2L and C2R outside the implantation range C1. The left and right side cups 42L and 42R are respectively disposed in the left and right monitor ranges C2L and C2R. The left and right side cups 42L and 42R can measure the ion beam B subject to over-scanning performed on the monitor ranges C2L and C2R during the implantation process.

The profiler cup 44 is retreated to a non-irradiation range C4R outside the irradiation range C3 during the implantation process. In the illustrated configuration, the profiler driving device 45 is disposed on the right side. During the implantation process, the profiler cup 44 is retreated to the non-irradiation range C4R on the right side. In a configuration in which the profiler driving device 45 is disposed on the left side, during the implantation process, the profiler cup 44 may be retreated to a non-irradiation range C4L on the left side.

The profiler cup 44 is disposed in the implantation range C1 during a preparation process performed prior to the implantation process, and measures the beam current of the ion beam B in the implantation range C1. The profiler cup 44 measures the beam current while moving in the x-direction in the implantation range C1, and measures a beam current density distribution of the scan beam SB in the x-direction. The profiler cup 44 measures the beam current at the position of the wafer processing surface by moving in the x-direction along a plane (measurement surface MS) coincident with the wafer processing surface in the implantation process.

The plurality of tuning cups 47 are disposed in the implantation range C1, and measure the beam current of the ion beam B in the implantation range C1. The plurality of tuning cups 47 are disposed at positions separated to the downstream side away from the wafer W. The tuning cups 47 do not need to be moved between the implantation range C1 and the non-irradiation range C4R unlike the profiler cup 44. Therefore, compared to the profiler cup 44, the beam current in the implantation range C1 can be more easily measured by the tuning cups 47.

In the preparation process, beam current measurement values are measured by various Faraday cups provided inside the implantation processing chamber 16. Specifically, a plurality of the beam current measurement values are measured by using the side cups 42L and 42R, the profiler cup 44, and the plurality of tuning cups 47. The control device 60 stores a ratio between the acquired beam current measurement values so that the beam current value on the wafer processing surface can be calculated from the beam current measurement values measured by the side cups 42L and 42R during the implantation process. Normally, the ratio between the beam current measurement values measured by various Faraday cups depends on a setting of a beam optical system in the beamline device 14. Even when the beam current of the ion beam B extracted from the ion generation device 12 slightly fluctuates, the ratio between the beam current measurement values is substantially constant. That is, when the setting of the beam optical system is determined during the preparation process, the ratio between the beam current measurement values during the subsequent implantation process is not changed. Therefore, when the ratio between the beam current measurement values is stored during the preparation process, based on the ratio and the beam current measurement values measured by the side cups 42L and 42R, it is possible to calculate the beam current value at the implantation position (that is, the wafer processing surface) where the ions are implanted into the wafer W during the implantation process.

During the implantation process, the beam current can be measured at all times using the side cups 42L and 42R. During the implantation process, the beam current cannot be measured at all times and can be only intermittently measured, using the profiler cup 44 or the tuning cup 47. Therefore, during the implantation process, a dose of the ions implanted into the wafer processing surface is controlled, based on beam current measurement values measured by the side cups 42L and 42R. When the beam current measurement values measured by the side cups 42L and 42R is changed during the implantation process, a dose distribution on the wafer processing surface is adjusted by changing a speed of the reciprocating movement of the wafer W in the y-direction. For example, when an in-plane uniform dose distribution needs to be realized on a plane of the wafer processing surface, the wafer W is caused to reciprocate at a speed proportional to the beam current measurement value monitored by the side cups 42L and 42R. Specifically, when the beam current measurement value to be monitored increases, the reciprocating movement of the wafer W is set to be fast, and when the beam measurement current value to be monitored decreases, the reciprocating movement of the wafer W is set to be slow. In this manner, it is possible to prevent the dose distribution on the wafer processing surface from varying due to fluctuations in the beam current of the scan beam SB.

Figure 4:
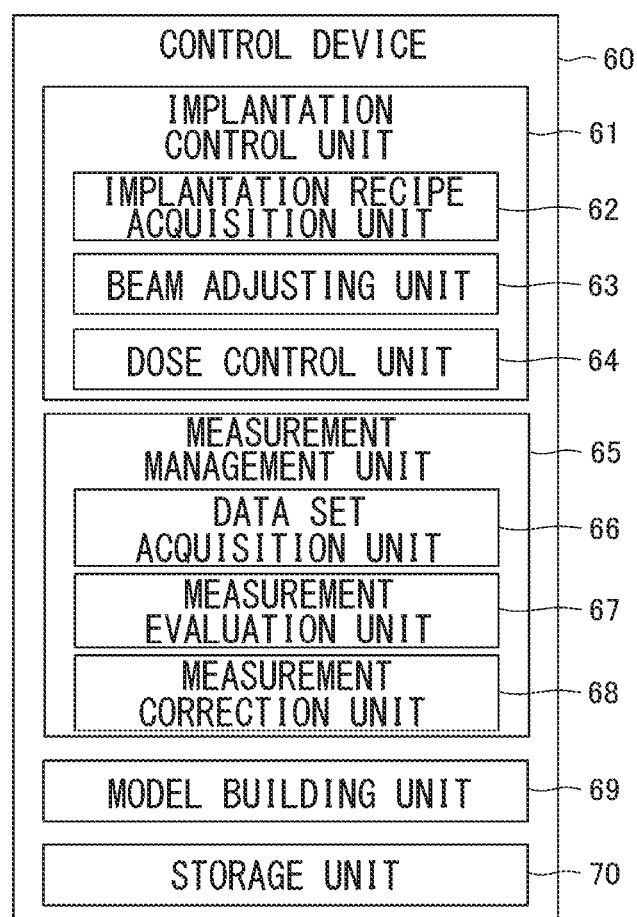
FIG. 4 is a block diagram schematically illustrating a functional configuration of a control device.

FIG. 4 is a block diagram schematically illustrating a functional configuration of the control device 60. The control device 60 includes an implantation control unit 61, a measurement management unit 65, a model building unit 69, and a storage unit 70.

The implantation control unit 61 controls an operation of the ion implanter 10, based on an implantation recipe. The measurement management unit 65 evaluates measurement validity, based on the plurality of measurement values measured by the plurality of measurement devices, and corrects the measurement value when necessary. The measurement management unit 65 evaluates the measurement validity, and corrects the measurement value by using a model representing a correlation between the plurality of measurement values. The model building unit 69 builds a model used by the measurement management unit 65. The storage unit 70 stores the implantation recipe, operation parameters for realizing the implantation recipe, measurement values measured by the plurality of measurement devices, and the model representing the correlation between the plurality of measurement values.

The implantation control unit 61 includes an implantation recipe acquisition unit 62, a beam adjusting unit 63, and a dose control unit 64.

The implantation recipe acquisition unit 62 acquires the implantation recipe in which the implantation parameters such as the ion species, the beam energy, the beam current, the beam size, the wafer tilt angle, the wafer twist angle, and the average dose are defined. In the implantation recipe, the implantation parameter for performing non-uniform implantation may be defined. In the implantation recipe, a two-dimensional dose distribution for the non-uniform implantation may be defined, or a correction file for variably controlling the beam scan speed and the wafer movement speed may be defined.

The beam adjusting unit 63 generates the ion beam, based on the acquired implantation recipe. The beam adjusting unit 63 adjusts the operation parameters of various devices constituting the ion implanter 10 so that the implantation parameters defined in the desired implantation recipe are realized. The beam adjusting unit 63 controls the ion species of the ion beam by adjusting a gas type and an extraction voltage of the ion generation device 12, and the intensity of the magnetic field of the mass analyzing unit 20. The beam adjusting unit 63 controls the beam energy of the ion beam by adjusting the extraction voltage of the ion generation device 12, an application voltage of the beam parallelizing unit 34, an application voltage of the AD column, and an application voltage of the angular energy filter 36. The beam adjusting unit 63 controls the beam current of the ion beam by adjusting various parameters such as a gas flow rate, an arc current, an arc voltage, and a source magnet current of the ion generation device 12, and an opening width of the mass analyzing slit 23. The beam adjusting unit 63 controls the beam size of the ion beam incident into the wafer processing surface WS by adjusting operation parameters of the focusing/defocusing device included in the beam shaping unit 30.

The beam adjusting unit 63 adjusts the beam, based on the measurement value of the physical quantity of the ion beam acquired during the preparation process. The beam adjusting unit 63 may adjust the beam, based on the measurement value corrected by the measurement management unit 65.

The dose control unit 64 controls the average dose and the dose distribution to be implanted into the wafer W during the implantation process. When the non-uniform implantation is performed, the dose control unit 64 variably controls the beam scan speed and the wafer movement speed, based on the acquired implantation recipe. The dose control unit 64 variably controls the beam scan speed by controlling a scanning voltage parameter commanded to the beam scanning unit 32, and variably controls the wafer movement speed by controlling a speed parameter commanded to the reciprocating mechanism 54.

The dose control unit 64 decreases a time change rate dV/dt of the scanning voltage so that the beam scan speed becomes slower at a location where the dose is to be relatively high, and increases time change rate dV/dt of the scanning voltage so that the beam scan speed becomes faster at a location where the dose is to be relatively low. The dose control unit 64 sets the wafer movement speed to become slower at the location where the dose is to be relatively high, and sets the wafer movement speed to become faster at the location where the dose is to be relatively low.

The dose control unit 64 adjusts the beam scan speed, based on the measurement value of the physical quantity of the ion beam acquired during the preparation process. The dose control unit 64 adjusts the beam scan speed, based on the measurement value of the beam current density distribution in the x-direction which is measured by the profiler cup 44, for example. The dose control unit 64 adjusts the wafer movement speed, based on the measurement value of the physical quantity of the ion beam acquired during the implantation process. The dose control unit 64 adjusts the wafer movement speed so as to reduce the influence of the fluctuation of the beam current during the implantation process, based on the beam current measurement values measured by the side cups 42L and 42R, for example. The dose control unit 64 may adjust at least one of the beam scan speed and the wafer movement speed, based on the measurement value corrected by the measurement management unit 65.

The measurement management unit 65 includes a data set acquisition unit 66, a measurement evaluation unit 67, and a measurement correction unit 68. The data set acquisition unit 66 acquires a data set including various data required for evaluation and correction of the measurement. The data set includes the plurality of measurement values measured by the plurality of measurement devices. For example, the data set includes a plurality of beam current measurement values measured by the side cups 42L and 42R, the profiler cup 44, and the tuning cups 47. The data set may include various parameters relating to the beam, which serve as a measurement target. The data set may include at least one of the implantation parameters defined in the implantation recipe. The data set may include at least one of the operation parameters of various devices for realizing at least one implantation parameter. The data set acquisition unit 66 may cause the storage unit 70 to accumulate a plurality of data sets acquired during the plurality of implantation processes. The plurality of data sets accumulated in the storage unit 70 can be used as input data for building the model.

Based on the acquired data set, the measurement evaluation unit 67 evaluates whether or not a plurality of measurement values included in the data set are valid. The measurement evaluation unit 67 refers to the model representing a correlation between a plurality of measurement values when the measurements are normally performed. When the correlation between the plurality of measurement values included in the data set corresponds to the model, the measurement evaluation unit 67 determines that the plurality of measurement values are valid. In other words, it is determined that the measurement relating to the plurality of measurement values is normal. On the other hand, when the correlation between the plurality of measurement values included in the data set does not correspond to the model, it is determined that the plurality of measurement values are not valid. In other words, it is determined that the measurement relating to the plurality of measurement values is abnormal. As an index indicating the measurement validity, for example, it is possible to use a value (for example, a distance or a deviation) indicating how much the plurality of measurement values included in the data set deviate from a reference model. Details of the model presenting the correlation between the plurality of measurement values will be described later.

The measurement correction unit 68 corrects at least one of the plurality of measurement values included in the data set by using the model representing the correlation between the plurality of measurement values when the measurements are normally performed. When the correlation between the plurality of measurement values deviates from the model, the measurement correction unit 68 corrects at least one of the plurality of measurement values so that the correlation between a plurality of corrected measurement values corresponds to the model. For example, when it is determined that the measurement relating to the plurality of measurement values is abnormal, the measurement correction unit 68 corrects at least one of the plurality of measurement values. In this manner, at least one abnormal value of the plurality of measurement values is corrected to a value estimated as a normal value. The measurement correction unit 68 may correct at least one of the plurality of measurement values even when it is determined that the measurement relating to the plurality of measurement values is normal. The measurement values are corrected, based on the model. In this manner, it is possible to correct the normal measurement value to a more accurate value when the measurement value slightly deviates from the model due to a measurement error. The corrected measurement value can be used for the beam adjustment or the dose control.

The model building unit 69 builds the model used by the measurement evaluation unit 67 or the measurement correction unit 68. The model building unit 69 builds the model representing a correlation between the plurality of measurement values by inputting a data set including the plurality of measurement values when the measurements are normally performed. The model building unit 69 acquires the plurality of data sets when the measurements are normally performed, and builds the model by analyzing the correlation between the plurality of measurement values included in each of the plurality of data sets. The number of the data sets required for model building is not particularly limited. However, for example, the number is 50 to 200.

The plurality of data sets to be used for the model building may include the measurement values obtained by measuring the ion beams generated at different timings in order to realize the same implantation recipe, or may include the measurement values of the ion beam generated in order to realize the implantation recipes in which at least one of the implantation parameters and the operation parameters is different from each other. Each of the plurality of data sets may include only the measurement values of the ion beam in which at least one of the implantation parameters and the operation parameters satisfies a specific condition. The model building unit 69 may build the model by using only data sets for each of which the characteristics of the wafer serving as a measurement target and irradiated with the ion beam satisfy a predetermined condition. For example, the model may be built by using only the data sets when devices manufactured on an ion-implanted wafer can properly work.

Subsequently, model building according to the present embodiment will be described in detail. Hereinafter, building a model representing the correlation between the seven beam current measurement values measured by a total of seven measurement devices such as the left and right side cups 42L and 42R, the profiler cup 44, and the four tuning cups 47a to 47d will be described as an example. The physical quantity serving as a target for the model building may not be the measurement value of the beam current, and may be the measurement value relating to the beam angle measured by the above-described cups. In addition, the number of the measurement devices used for building the model is not limited to 7, and may be smaller than 6, or may be 8 or more. However, the number of the measurement devices is 3 or more, or is preferably 4 or more. By increasing the number of the measurement devices, it is possible to improve accuracy in evaluating measurement validity or accuracy in correcting the measurement value.

The model building unit 69 acquires the data sets including the plurality of beam current measurement values obtained by the measurement in the plurality of cups. The plurality of beam current measurement values can be expressed as array data or a measurement value vector x ($x_1$, $x_2$, ..., $x_i$, ..., $x_n$) having dimensions (for example, 7 dimensions) of the number n (for example, 7) of the plurality of cups. The model building unit 69 acquires a plurality of measurement value vectors x, and specifies a function f(x) representing the correlation between the plurality of acquired measurement value vectors x. For example, the model building unit 69 specifies a linear function representing the correlation between the plurality of measurement value vectors x by a principal component analysis (PCA). The linear function specified by the principal component analysis can be expressed as a straight line extending in a principal component direction when the plurality of measurement value vectors x are plotted in a space having n-dimensions (7-dimensions). The function f(x) representing the correlation between the plurality of measurement value vectors x is not limited to the linear function, and may be any desired non-linear function.

Figure 5:
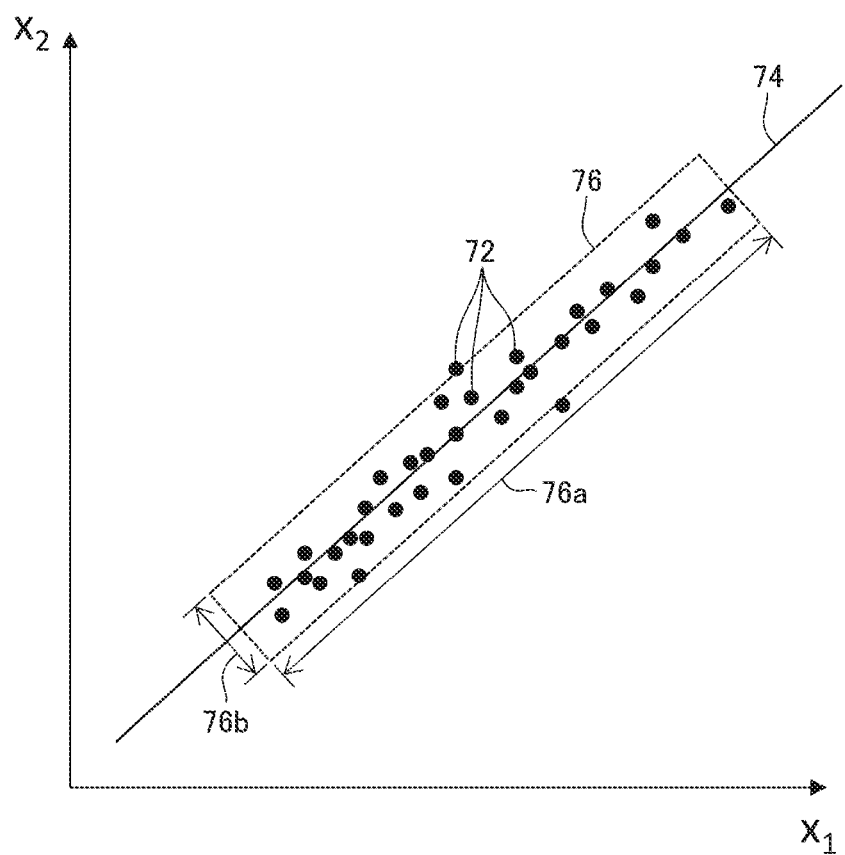
FIG. 5 is a view schematically illustrating a function representing a correlation between a plurality of measurement value vectors.

FIG. 5 is a view schematically illustrating a function representing the correlation between the plurality of measurement value vectors. In a graph of FIG. 5, due to limitation of description, only the two dimensions of a measurement value $x_1$ of a first cup and a measurement value $x_2$ of a second cup are illustrated. However, the space actually has the n-dimensions (for example, 7-dimensions). Plots 72 on the graph are disposed in position coordinates indicated by the measurement value vector x. A straight line 74 on the graph is an approximate straight line of the plurality of plots 72, and is the linear function f(x) representing the correlation between the plurality of measurement value vectors x. The straight line 74 is defined as a straight line passing through a center of a distribution of the plurality of plots 72 and extending in a first principal component direction. For example, when a center coordinate of the distribution of the plurality of plots 72 is set to $x_0$ and a unit vector in the first principal component direction is set to v, the straight line 74 can be expressed as a formula of $x_0+tv$ by using a parameter t.

The model building unit 69 determines a threshold value for evaluating measurement validity, based on the distribution of the plurality of measurement value vectors x. For example, the threshold value for evaluating the measurement validity is defined as a reference region 76 illustrated in the graph of FIG. 5. When the measurement value vector x serving as an evaluation target is located inside the reference region 76, it is determined that the measurement value vector x is normal. On the other hand, when the measurement value vector x serving as the evaluation target is located outside the reference region 76, it is determined that the measurement value vector x is abnormal. The reference region 76 can be defined by a first range 76a in the first principal component direction along the straight line 74 and a second range 76b in a second principal component direction perpendicular to the straight line 74. The first range 76a can be defined, based on a $T^2$ statistic indicating variations in the distribution in the first principal component direction. The $T^2$ statistic can be expressed as $T^2=\Sigma(t/\sigma_t)^2$ by using a component t in the first principal component direction of the distribution of the measurement value vectors x and a standard deviation $\sigma_t$ in the first principal component direction of the distribution. The second range 76b can be defined by using a Q statistic indicating variations in distribution in the second principal component direction perpendicular to the first principal component direction. The Q statistic can be expressed as $Q=\Sigma q^2$ by using a distance q from a first principal component axis (for example, the straight line 74) to the measurement value vector x. The distance q can be expressed as $q=|x-x_t|$ by using a position coordinate $x_t=x_0+tv$ when the measurement value vector x is projected onto the first principal component axis. A specific range serving as the threshold value can be defined as a range in which the $T^2$ statistic or a Q statistic becomes a predetermined value. For example, the threshold value can be defined so that 99.5% of the distribution of the plurality of measurement value vectors x are included inside the reference region 76. The threshold value for defining the reference region 76 may not be a fixed value, and may be a variable value in accordance with required implantation accuracy.

Figure 6:
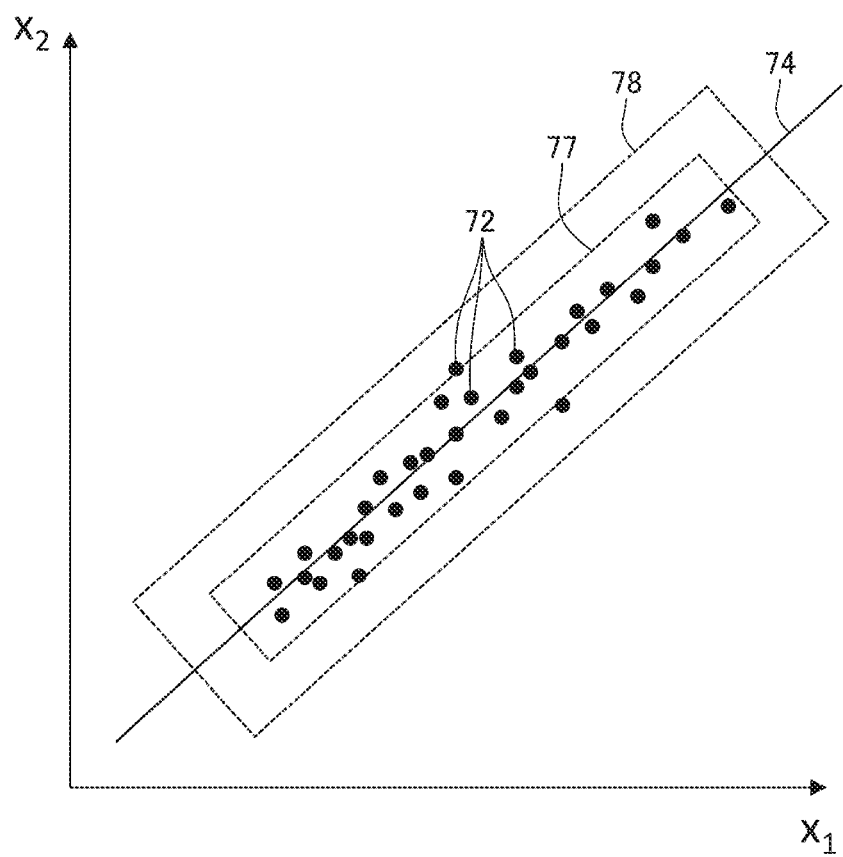
FIG. 6 is a view schematically illustrating a plurality of threshold values set for a model.

The model building unit 69 may determine a plurality of threshold values for one model. FIG. 6 is a view schematically illustrating the plurality of threshold values set for one model. In FIG. 6, a first reference region 77 and a second reference region 78 are set as the plurality of threshold values for the one model. The first reference region 77 is a range in which the measurement value vector x serving as the evaluation target is evaluated to be normal. The measurement value vector x included in the first reference region 77 may be corrected, or may not be corrected. The second reference region 78 is a range in which the measurement value vector x serving as the evaluation target is evaluated to be abnormal, and is a range in which the measurement value vector x can be corrected. The range that does not correspond to either the first reference region 77 or the second reference region 78 is a range in which the measurement value vector x serving as the evaluation target is evaluated to be abnormal and the measurement value vector x cannot be corrected.

The model building unit 69 may build a general-purpose model applicable to various implantation recipes, or may build an individual model applicable only to a specific implantation recipe. For example, the individual model can be built by using only the measurement value vectors x that satisfy a specific condition, as inputs for the model building. For example, the individual model can be built by using only the measurement value vectors x measured under a situation that a specific implantation parameter or a specific operation parameter satisfies a predetermined condition, as inputs for the model building. The model building unit 69 may build the general-purpose model with incorporating a value of the implantation parameter or the operation parameter in the model. In this case, the individual model can be built by limiting the value of the implantation parameter or the operation parameter incorporated in the general-purpose model to satisfy a predetermined condition. Here, the specific implantation parameter or the specific operation parameter may be a parameter that does not directly relate to the measurement values. For example, in a case of a model for the beam current measurement value, a limited target may be the implantation parameter different from the beam current such as the ion species, the beam energy, or the beam angle, and the operation parameter for controlling the implantation parameter different from the beam current. Such model can be a model representing the correlation between the plurality of measurement values and at least one of the implantation parameters and the operation parameters.

The model building unit 69 may preprocess the measurement value vector x used as the input for the model building. For example, the beam current measurement value $x_i$ may be standardized by using an average value $\mu_i$ and a standard deviation $\sigma_i$ of the distribution of the beam current measurement values $x_i$ measured by a specific measurement device i. A standardized beam current measurement value $x_i'$ can be expressed as $x_i'=(x_i-\mu_i/\sigma_i$. The beam current measurement value $x_i$ may be standardized for each measurement device. In this manner, it is possible to equalize the variations in the measurement in each cup, and it is possible to uniform contribution of each measurement device to the model.

In the model building unit 69, each measurement device may have an individual contribution to the model. For example, an adjustment coefficient $\alpha_i$ indicating the contribution of each measurement device may be set for each measurement device, and the model may be built by inputting a beam current measurement value $\alpha_i x_i$ which is adjusted by multiplying the beam current measurement value $x_i$ by the adjustment coefficient $\alpha_i$. The standardized beam current measurement value $x_i'$, may be multiplied by the adjustment coefficient $\alpha_i$. The model may be built by inputting a standardized and adjusted beam current measurement value $\alpha_i x_i'$. The value of the adjustment coefficient $\alpha_i$ may be determined, based on reliability of the measurement in each measurement device. For example, whereas the adjustment coefficient $\alpha_i$ of the measurement device that is less likely to cause a measurement error and has high reliability may be set to be relatively higher, the adjustment coefficient $\alpha_i$ of the measurement device that is more likely to cause the measurement error and has low reliability may be set to be relatively lower.

The model building unit 69 may be configured so that the value of the adjustment coefficient $\alpha_i$ is variable for each model. For example, for the individual model applied to the specific implantation recipe, the adjustment coefficient $\alpha_i$ of the specific measurement device may be set to a value different from that for the general-purpose model or other individual models. For example, in the implantation recipe that requires a high beam current, the beam is likely to spread on the downstream side of the beamline A, and the beam is in a situation where the whole beam is less likely to be incident into the tuning cups 47 disposed on the most downstream side of the beamline A. In this case, the measurement values of the tuning cups 47 become smaller than ideal beam current measurement values, thereby causing relatively large measurement errors. Therefore, in the individual model applied to the implantation recipe in which the beam is likely to spread, the adjustment coefficients $\alpha_i$ applied to the tuning cups 47 may be set to small values so that the measurement errors in the tuning cups 47 are less likely to be reflected in the model. In addition, the measurement values of the side cups 42 may vary depending on a scanning condition of the beam. Therefore, in the individual model applied to the implantation recipe for non-uniform implantation, the adjustment coefficients $\alpha_i$ applied to the side cups 42 may be variable in accordance with a velocity distribution or a scanning range of the beam scan. The adjustment coefficient $\alpha_i$ of the specific measurement device may be individually set in accordance with the implantation parameter defined in the implantation recipe or the operation parameter for realizing the implantation recipe.

Next, evaluation and correction of the measurement values by using the built model will be described in detail.

The measurement evaluation unit 67 acquires a data set including a plurality of measurement values serving as the evaluation target. The measurement evaluation unit 67 selects a model to be used for the evaluation, based on the implantation parameter or the operation parameter included in the acquired data set. When the individual model corresponding to the implantation parameter or the operation parameter in the acquired data set is built, the measurement evaluation unit 67 uses the individual model corresponding to the acquired data set for the evaluation. When the individual model corresponding to the implantation parameter or the operation parameter in the acquired data set is not built, the measurement evaluation unit 67 may use the general-purpose model for the evaluation.

The measurement evaluation unit 67 refers to the selected model, and evaluates the validity of the plurality of measurement values included in the acquired data set. For example, the measurement evaluation unit 67 plots the measurement value vectors corresponding to the plurality of acquired measurement values on the graph of FIG. 5, and determines whether or not the plotted measurement value vector is located inside the range of the reference region 76. When the measurement value vector is located inside the range of the reference region 76, the measurement evaluation unit 67 determines that the measurement relating to the acquired data set is normal. On the other hand, when the measurement value vector is located outside the range of the reference region 76, the measurement evaluation unit 67 determines that the measurement relating to the acquired data set is abnormal. When the measurement value vector is standardized or weighted by the adjustment coefficient $\alpha_i$ in the selected model, the measurement evaluation unit 67 applies standardization or weighting adjustment to the plurality of acquired measurement values, and thereafter, evaluates the measurement validity.

The measurement evaluation unit 67 may calculate an index indicating the validity of the plurality of measurement values by referring to the selected model. The measurement evaluation unit 67 may calculate a value (a deviation amount) indicating how much a measurement value vector 82 corresponding to the plurality of measurement values deviates from the model, as the index indicating the validity of the plurality of measurement values. For example, a distance from the straight line 74 indicated by the model to the measurement value vector 82, that is, a distance in the second principal component direction perpendicular to the first principal component direction may be calculated as a first index. The first index may be calculated, based on the above-described Q statistic. In addition, a distance in the direction along the first principal component direction from the center coordinate $x_0$ of the model to the measurement value vector 82 may be calculated as a second index. The second index may be calculated, based on the above-described $T^2$ statistic. The first index and the second index may be values standardized or normalized, based on a standard deviation $\sigma$ of the distribution. The measurement evaluation unit 67 may evaluate the validity of the plurality of measurement values, based on at least one of the calculated first index and the calculated second index. The measurement evaluation unit 67 may evaluate whether the measurement is normal or abnormal by comparing the calculated index with the threshold values corresponding to the above-described reference regions 76, 77, and 78.

Figure 7:
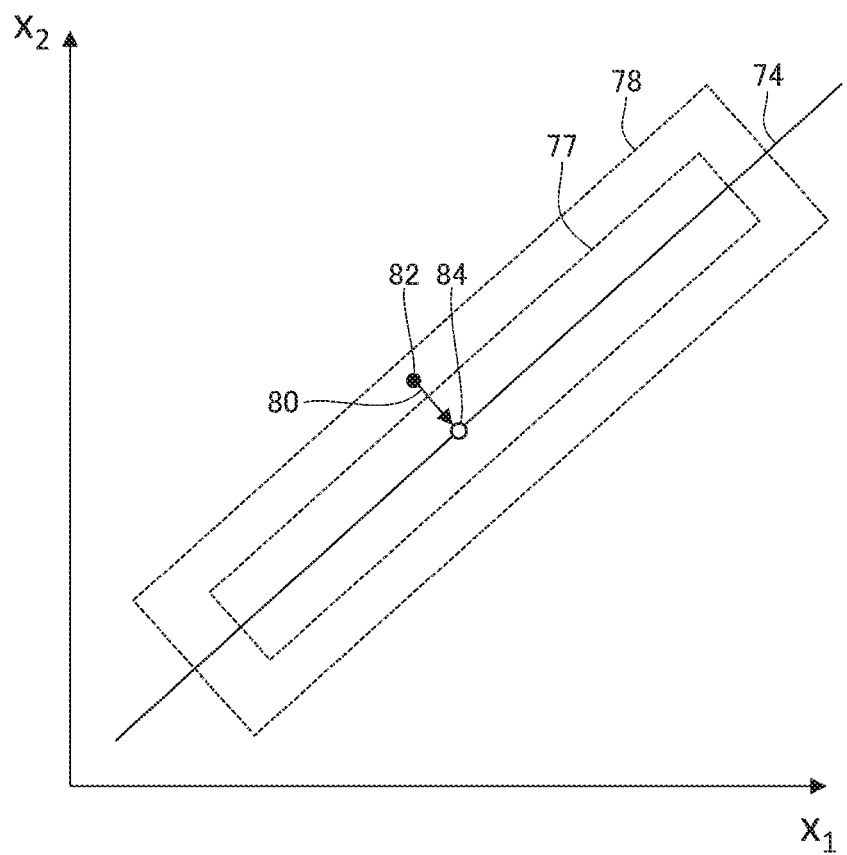
FIG. 7 is a graph schematically illustrating a correction method of the measurement value vectors.

The measurement correction unit 68 corrects the plurality of measurement values evaluated by the measurement evaluation unit 67, based on the model. FIG. 7 is a graph schematically illustrating a correction method of the measurement value vectors. For example, the measurement correction unit 68 plots the measurement value vector 82 corresponding to the plurality of acquired measurement values on the graph of FIG. 7, and calculates the vector closest to the measurement value vector 82 on the straight line 74 indicated by the model, as the corrected measurement value vector 84. A correction direction indicated by an arrow 80 from the uncorrected measurement value vector 82 to the corrected measurement value vector 84 is a direction perpendicular to the straight line 74 indicated by the model.

The measurement correction unit 68 corrects the plurality of measurement values by using the same model used for the evaluation by the measurement evaluation unit 67. When the measurement value vector is standardized or weighted by the adjustment coefficient $\alpha_i$ in the model, the measurement correction unit 68 corrects the measurement value vector in a state where the standardization and weighting adjustment have been performed. The measurement correction unit 68 may calculate the corrected measurement values by performing an inverse operation on the corrected measurement value vector 84 to release the standardization and weighting adjustment. Specifically, when the corrected measurement value vectors 84 are set to y $(y_1, y_2, \ldots, y_i, \ldots, y_n)$, the corrected beam current measurement value $y_i'$ can be expressed as $y_i'=(\sigma_i \cdot y_i/\alpha_i)+\mu_i$. Here, $\alpha_i$ is the adjustment coefficient in the specific measurement device i, $\sigma_i$ is the standard deviation in the specific measurement device i, and $\mu_i$ is the average value in the specific measurement device i.

When the measurement evaluation unit 67 determines that the measurement is abnormal, the beam adjusting unit 63 may output an alert to stop the beam adjustment. When the measurement evaluation unit 67 determines that the measurement is abnormal, the beam adjusting unit 63 may modify the operation parameters of the beam generation device to readjust the beam so that the measurement becomes normal. When the measurement evaluation unit 67 determines that the measurement is abnormal even after the beam is readjusted, the beam adjusting unit 63 may output an alert to stop the beam adjustment.

The beam adjusting unit 63 may adjust the beam, based on the corrected beam current measurement value $y_i'$ calculated by the measurement correction unit 68. The beam adjusting unit 63 may adjust the beam so that the corrected beam current measurement value $y_i'$ becomes the beam current designated by the implantation recipe. The beam adjusting unit 63 may adjust the beam, based on the corrected beam current measurement value $y_i'$ corresponding to the specific measurement device i, and may adjust the beam with reference to the corrected beam current measurement value $y_i'$ in the profiler cup 44, for example.

The dose control unit 64 may perform dose control, based on the corrected beam current measurement value $y_i'$ calculated by the measurement correction unit 68. The dose control unit 64 may perform the dose control, based on the corrected beam current measurement value $y_i'$ corresponding to the specific measurement device i, and may adjust a scan velocity distribution of the ion beam with reference to the corrected beam current measurement value $y_i'$ in the profiler cup 44, for example. The dose control unit 64 may adjust the wafer movement speed to reduce the influence of fluctuations in the beam current during the ion implantation, with reference to a ratio between the corrected beam current measurement values $y_i'$ in the side cups 42 and the profiler cup 44.

Figure 8:
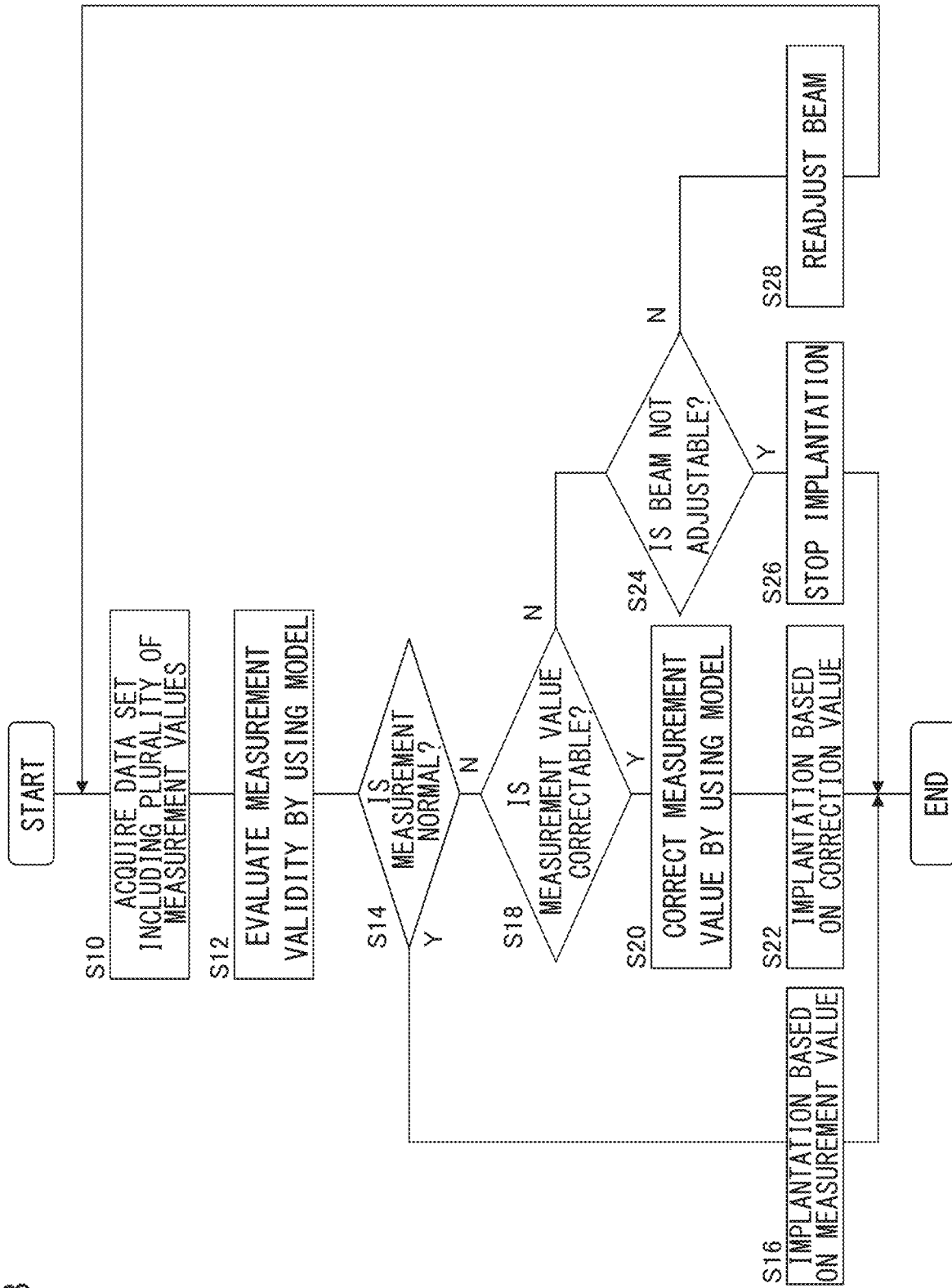
FIG. 8 is a flowchart schematically illustrating a flow of an ion implantation method according to an embodiment.

FIG. 8 is a flowchart schematically illustrating a flow of an ion implantation method according to an embodiment. The control device 60 acquires the data set including the plurality of measurement values (S10), and evaluates the measurement validity of the plurality of measurement values by using the model (S12). When the measurement is normal (Y in S14), the ion implantation process is performed, based on the acquired measurement values (S16). When the measurement is abnormal (N in S14) and the measurement values can be corrected (Y in S18), the measurement values are corrected by using the model (S20), and the ion implantation process is performed, based on the correction values (S22). When the measurement values cannot be corrected (N in S18) and the beam cannot be adjusted (Y in S24), the implantation process is aborted (S26). When the measurement values cannot be corrected (N in S18) and the beam can be adjusted (N in S24), the beam is readjusted (S28), and the process returns to an initial stage of the flow to perform again the processes from S10.

According to the present embodiment, the measurement validity relating to the plurality of measurement values is evaluated by using the model. In this manner, it is possible to more accurately detect whether the abnormality in the measurement is present or absent. According to the present embodiment, the model representing the correlation between the plurality of measurement values acquired during normal operations of the ion implanter is referred to. In this manner, it is possible to easily specify whether or not at least one of the plurality of measurement values is measured in a state deviating from that during the normal operations of the ion implanter. In particular, by increasing the number of measurement devices adopted to the model, even a slight measurement error which occurs in any one of the measurement devices can be detected with high accuracy. In this manner, the ion implantation process can be performed, based on the measurement values evaluated as normal with high accuracy. Accordingly, the implantation accuracy can be improved.

According to the present embodiment, the measurement values can be corrected by using the model representing the correlation between the plurality of measurement values acquired during the normal operations of the ion implanter, and the ion implantation process can be performed, based on the correction values. In this manner, when it is determined that the abnormality occurs in the measurement due to a slight measurement error, it is possible to avoid aborting of the ion implantation process, and it is possible to prevent productivity from being lowered due to stopping of the ion implanter. In addition, the deviation from the model which may be caused by the measurement error is corrected. Accordingly, the deviations of the measurement values due to the measurement errors can be reduced, and the ion implantation process can be performed, based on the physical quantity having the more accurate value. In this manner, the implantation accuracy can be improved, compared to a case where the measurement values are not corrected.

Hitherto, the present invention has been explained with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various changes such as design changes can be added to the embodiment. The embodiment having such modifications can also be included in the scope of the present invention.

In the above-described embodiment, the model building unit 69 may update the built model each time. For example, the ion implanter 10 is continuously operated, and the data sets are acquired and accumulated in the storage unit 70 during many implantation processes corresponding to various implantation recipes. The model building unit 69 can update the model by increasing the number of plottings of the measurement value vectors to be reflected in the model, based on the data sets accumulated in the storage unit 70. For example, the model is built, based on the accumulated data sets. In this manner, it is possible to increase the number of types of individual models, each of which is applicable only to the specific implantation recipe. When the ion implanter 10 is operated for a short period of time, only the data sets corresponding to limited implantation recipes are accumulated. Accordingly, only the individual models corresponding to the limited implantation recipes can be built. On the other hand, when the data sets corresponding to various implantation recipes are accumulated since the ion implanter 10 is operated for a long period of time, various individual models respectively corresponding to the various implantation recipes can be built. Each of the individual models may be built for each of the various implantation recipes. In this manner, it is possible to improve the accuracy in evaluating the measurement validity and the accuracy in correcting the measurement value in the specific implantation recipe.

The measurement evaluation unit 67 may evaluate the measurement by using the general-purpose model at a timing when the individual model is not built by the model building unit 69, and may evaluate the measurement by using the individual model after a timing when the individual model is built by the model building unit 69. That is, the models used for the evaluation may be dynamically switched in accordance with a progress of the model building performed by the model building unit 69. The same manner may be applied to the model used for the correction by the measurement correction unit 68.

The model building unit 69 may update the model, based on a result of the ion implantation process performed by using the corrected measurement values. For example, the model building unit 69 may acquire information relating to characteristics or yields of devices manufactured on the ion-implanted wafer, based on the corrected measurement values, and may evaluate the influence of the correction of the measurement values. The model building unit 69 may update or rebuild the model to reduce a possibility that the devices are adversely affected by the correction of the measurement value.

The model built by the model building unit 69 may be used for another ion implanter. For example, a first model built based on the data set acquired in a first ion implanter may be used in evaluating the measurement validity and correcting the measurement value in a second ion implanter. In this case, instead of using the first model for the second ion implanter without any modification, a second model converted from the first model may be used for the second ion implanter. The second model may be a model in which a predetermined conversion coefficient $\beta$ is applied to the first model. Similarly to the above-described adjustment coefficient $\alpha$, the conversion coefficient $\beta$ may be a coefficient set for each measurement device. For example, the conversion coefficient $\beta$ may be set as a conversion coefficient $\beta_i$, by which each of the plurality of beam current measurement values $x_i$ is multiplied. A specific value of the conversion coefficient $\beta_i$ may be determined, based on the plurality of measurement values acquired in the second ion implanter.

The above-described conversion coefficient $\beta_i$ may be used to build the individual model used for the second ion implanter. For example, the following case is considered. Both the general-purpose model (also referred to as a first general-purpose model) and the individual model (also referred to as a first individual model) are built in the first ion implanter, and only the general-purpose model (also referred to as a second general-purpose model) is built in the second ion implanter. When the conversion coefficient $β_i$ is obtained between the first general-purpose model and the second general-purpose model, the same conversion coefficient $β_i$ may be applied to the first individual model to build the individual model (second individual model) used for the second ion implanter.

In the above-described embodiments, cases have been described where both evaluating the validity of the plurality of measurement values and correcting the plurality of measurement values are performed by using the model. As another embodiment, only evaluating the validity of the plurality of measurement values may be performed by using the model. As another embodiment, without evaluating the validity of the plurality of measurement values, only correcting the plurality of measurement values may be performed by using the model.

It should be understood that the invention is not limited to the above-described embodiments, but may be modified into various forms on the basis of the spirit of the invention. Additionally, the modifications are included in the scope of the invention.

What is claimed is:

1. An ion implanter comprising:
a beam generator configured to generate an ion beam, based on an implantation recipe;
a plurality of measurement devices that measure a beam current of the ion beam; and
a controller configured to:
acquire a data set including a plurality of measurement values indicating the beam current of the ion beam and an implantation parameter in the implantation recipe; and
evaluate measurement validity of the beam current of the ion beam by using the model;
wherein:
the implantation parameter comprises one of ion species, beam energy, a beam current, a beam size, a wafer tilt angle, a wafer twist angle and an average dose; and
the model is built based on a plurality of past data sets acquired during a plurality of implantation process based on the implantation recipe.

2. The ion implanter according to claim 1,
wherein the plurality of past data sets includes one or more data sets acquired from an ion implanter other than the ion implanter.

3. The ion implanter according to claim 1, wherein the plurality of past data sets are acquired from a plurality of ion implanters.

4. The ion implanter according to claim 1,
wherein the controller is configured to acquire an operation parameter of the beam generator, as a parameter included in the data set, and
the model represents a correlation between the plurality of measurement values and the at least one operation parameter.

5. The ion implanter according to claim 1,
wherein the controller is configured to adjust an operation parameter of the beam generator, based on an evaluation result of the measurement validity of the beam current of the ion beam.

6. The ion implanter according to claim 1,
wherein the controller is configured to correct a value of the beam current of the ion beam by using the model.

7. The ion implanter according to claim 1,
wherein the plurality of measurement devices include a first measurement device that is configured to measure the ion beam at an implantation position where the ion beam is incident into a wafer, and a second measurement device that is configured to measure the ion beam at a position different from the implantation position, and
the controller is configured to correct a measurement value of the first measurement device by using the model.

8. The ion implanter according to claim 6,
wherein the controller is configured to control a dose in an implantation process in which a wafer is irradiated with the ion beam, based on a correction value of the beam current of the ion beam.

9. The ion implanter according to claim 1,
wherein the controller is configured to:
accumulate a plurality of the data sets acquired during a plurality of implantation processes based on the implantation recipes different from each other; and
build the model from the plurality of accumulated data sets.

10. The ion implanter according to claim 9,
wherein the controller is configured to:
acquire information relating to an evaluation result of a semiconductor device manufactured by using the implantation process in which a wafer is irradiated with the ion beam; and
build the model from the data sets acquired during the implantation process used for manufacturing the semiconductor device having the evaluation result which satisfies a predetermined condition.

11. An implantation method comprising:
generating an ion beam based on an implantation recipe;
measuring a beam current of the ion beam by using a plurality of measurement devices;
acquiring a data set including a plurality of measurement values indicating the beam current of the ion beam and an implantation parameter in the implantation recipe, wherein the implantation parameter comprises one of ion species, beam energy, a beam current, a beam size, a wafer tilt angle, a wafer twist angle, and an average dose; and
evaluating measurement validity of the beam current of the ion beam by using a model representing a correlation between the plurality of measurement values and the implantation parameter, wherein the model is built based on a plurality of past data sets acquired during a plurality of implantation process based on the implantation recipe.

12. The ion implantation method according to claim 11,
wherein the plurality of past data sets include one or more data sets acquired from an ion implanter other than the ion implanter.

13. The ion implantation method according to claim 11,
wherein the plurality of past data sets are acquired from a plurality of ion implanters.

* * * * *